(12) United States Patent
Jansen

(10) Patent No.: US 7,940,218 B2
(45) Date of Patent: *May 10, 2011

(54) MULTILAYER PCB ANTENNA

(75) Inventor: Stefan Jansen, Valby (DK)

(73) Assignee: Nokia Corporation, Espoo (FI)

( * ) Notice: Subject to any disclaimer, the term of this patent is extended or adjusted under 35 U.S.C. 154(b) by 0 days.

This patent is subject to a terminal disclaimer.

(21) Appl. No.: 10/084,981

(22) Filed: Mar. 1, 2002

(65) Prior Publication Data

US 2002/0122007 A1 Sep. 5, 2002

(30) Foreign Application Priority Data

Mar. 2, 2001 (GB) .................................. 0105251.3
Mar. 5, 2001 (GB) .................................. 0105413.9

(51) Int. Cl.
*H01Q 1/38* (2006.01)
(52) U.S. Cl. ........................................ 343/702; 343/846
(58) Field of Classification Search .................. 343/741, 343/742, 702, 700 MS, 795, 726, 826, 893, 343/895, 846

See application file for complete search history.

(56) References Cited

U.S. PATENT DOCUMENTS

| | | | | |
|---|---|---|---|---|
| 2,501,430 A | * | 3/1950 | Andrew | 343/741 |
| 4,860,019 A | * | 8/1989 | Jiang et al. | 343/795 |
| 4,873,529 A | | 10/1989 | Gibson | |
| 4,975,711 A | * | 12/1990 | Lee | 343/702 |
| 4,994,820 A | * | 2/1991 | Suzuki et al. | 343/846 |
| 5,319,378 A | | 6/1994 | Nalbandian | |
| 5,530,919 A | * | 6/1996 | Tsuru et al. | 455/575.5 |
| 5,668,559 A | * | 9/1997 | Baro | 343/702 |
| 5,828,340 A | | 10/1998 | Johnson | |
| 5,859,614 A | | 1/1999 | Paolella | |
| 5,870,065 A | * | 2/1999 | Kanba et al. | 343/895 |
| 5,898,404 A | | 4/1999 | Jou | |
| 6,052,093 A | | 4/2000 | Yao et al. | |
| 6,057,803 A | * | 5/2000 | Kane et al. | 343/713 |
| 6,075,485 A | | 6/2000 | Lilly | |
| 6,107,970 A | * | 8/2000 | Holshouser et al. | 343/702 |
| 6,156,684 A | | 12/2000 | Sato et al. | |
| 6,204,814 B1 | | 3/2001 | Rothe | |
| 6,215,455 B1 | | 4/2001 | D'Angelo | |
| 6,348,892 B1 | * | 2/2002 | Annamaa et al. | 343/700 MS |
| 6,377,227 B1 | | 4/2002 | Zhu | |
| 6,384,785 B1 | * | 5/2002 | Kamogawa et al. | 343/700 MS |

(Continued)

FOREIGN PATENT DOCUMENTS

DE 29701589 U1 4/1997

(Continued)

OTHER PUBLICATIONS

Soras, C. et al: "Analysis and Design of an 8 Inverted-F Antenna Printed on a PCMCIA Card for the 2.4 GHz ISM Band", IEEE Antennas and Propatation Magazine, IEEE Inc., New York, US, vol. 44, No. 1, Feb. 2002, pp. 37-44, XP001101586 ISSN: 1045-9243.

(Continued)

*Primary Examiner* — Michael C Wimer
(74) *Attorney, Agent, or Firm* — Harrington & Smith

(57) ABSTRACT

An antenna may include an element formed from conductor patterns on a plurality of layers including at least one buried layer of a multilayer PCB. The conductor patterns are in stacked relation and interconnected through the PCB. A mobile phone may include such an antenna.

60 Claims, 3 Drawing Sheets

U.S. PATENT DOCUMENTS

| | | | |
|---|---|---|---|
| 6,424,317 | B2 | 7/2002 | Rudish |
| 6,501,425 | B1 | 12/2002 | Nagumo |
| 6,542,050 | B1 | 4/2003 | Arai |
| 6,759,984 | B2 | 7/2004 | Wielsma |
| 6,940,456 | B2 | 9/2005 | Wielsma |
| 6,977,626 | B2 | 12/2005 | Wielsma |
| 6,982,671 | B2 | 1/2006 | Killen |
| 6,992,637 | B2 | 1/2006 | Hwang |
| 7,439,919 | B2 * | 10/2008 | Jansen ............ 343/702 |
| 2005/0179600 | A1 | 8/2005 | Wielsma |

FOREIGN PATENT DOCUMENTS

| | | |
|---|---|---|
| EP | 0390600 A2 | 10/1990 |
| EP | 0 547 563 A1 | 6/1993 |
| EP | 0 762 539 | 8/1996 |
| EP | 0 757 405 A | 2/1997 |
| EP | 0 986 130 A2 | 3/2000 |
| GB | 2237451 A | 5/1991 |
| JP | 57-202102 A | 12/1982 |

OTHER PUBLICATIONS

L.B. Cebik, "Modeling and Understanding Small Beams", Pat 5: The ZL Special, pp. 1-15, Mar. 31, 2004 (http://www.cebik.com/mu/mu5a.html).

Robert E. Collin, Case Western Reserve University, "Antennas and Radiowave Propagation", pp. 107-149, McGraw-Hill Book Company, New York etc.

VE3GK Gerry King, "Antenna Element Traps" Mar. 31, 2004 (http://www.ve3gk.com/eltraps.htm, pp. 1-3; and Electric Antenna Element for XM Satellite radio/DAV223CLIT (http://www.toko.co.jp/products/new/antenna/dav2338cltt_e.htm (1 pg.); and Multi-tuned Active/Passive Antenna Element Characterization, by David Thompson, 2003 NASA Academy (8 pgs.).

Jimmy Ho, BEng(Hons), MEngSc senior Development Engineer—CSA Wireless, "Wideband Antenna Element" appearing in CSA Wireless, pp. 1-3 and A. B. Smolders et al, Netherlands Foundation for Research in Astronomy, Wide-Band Antenna Element with Integrated Balun, (4 pgs.) presented at the IEEE APS Int. Symposium Atlanta USA 1998.

R. S. Hewes, et al, Radio Data Reference Book, Part 5, pp. 130-133, Radio Society of Great Britain.

Bhartia, P. et al., *Millimeter-Wave Microstrip and Printed Circuit Antennas*, (Artech House, Inc., 1991), Chapter 3: Materials and Substrate Selection, pp. 47-55.

Lee, K. F. et al., *Advances in Microstrip and Printed Antennas*, (John Wiley & Sons, Inc., Lee, K. F. et al., eds, 1997), Chapter One: Probe-Fed Microstrip Antennas, pp. 1-4, 20 and 38.

Huang, J. et al., *Advances in Microstrip and Printed Antenna*, (John Wiley & Sons, Inc., Lee, K. F. et al., eds, 1997), Chapter Three: Microstrip Arrays: Analysis, Design, and Applications, pp. 123 and 124.

James, J. R. et al., *Advances in Microstrip and Printed Antennas*, (John Wiley & Sons, Inc., Lee, K. F. et al., eds, 1997), Chapter Six: Multifunction Printed Antennas, pp. 273-277 and 294-296.

* cited by examiner

MULTILAYER PCB ANTENNA

BACKGROUND OF THE INVENTION

1. Field of the Invention

The present invention relates to PCB antennas.

2. Description of the Prior Art

Bluetooth is a short range wireless networking system operating in the ISM 2.4 GHz band. The development of Bluetooth has required designers of disparate electronic devices to include rf circuitry for the first time and, in the case of mobile phones, additional rf circuitry. This of course can lead to undesirable increases in the size of devices to accommodate the electronics and the antenna or antennas required.

PCB antennas are disclosed in DE-U-29701 589, GB-A-2237451 and U.S. Pat. No. 5,898,404. However, in each of these documents the elements are formed from single layers of conductor.

SUMMARY OF THE INVENTION

An antenna according to the present invention is characterized in that the element is formed from conductor patterns on a plurality of layers of a multilayer PCB, wherein the conductor patterns are in stacked relation and interconnected through the PCB.

The term "element" is not used herein as a generic reference to any structure but is used with the sense normally given in the field of antennas, for example in phrases such as "2-element Yagi" and "parasitic element".

Preferably, the element is located at the edge of the PCB. This reduces the amount of lossy PCB material in the vicinity of the antenna, Additionally or alternatively, the PCB may be apertured adjacent to the element. This also reduces the amount of lossy PCB material in the vicinity of the antenna.

The present invention may be embodied in an inverted-F antenna comprising an F-shaped conductor pattern on a first layer of the PCB and an I-, L- or F-shaped conductor pattern on the or each other layer, wherein the or each I-shaped conductor pattern is substantially coextensive with the "upright" of the F-shaped conductor pattern.

Preferably, the or each I-, L- or F-shaped conductor pattern extends along the edge of the PCB.

Preferably, the PCB is apertured, for example, by means of a slot, between the "upright" of the F-shaped conductor pattern and a ground plane area.

An antenna ground plane may be provided by a plurality of vias connecting ground plane regions on respective PCB layers.

An antenna according to the present invention may be employed in a mobile phone.

DETAILED DESCRIPTION OF THE PREFERRED EMBODIMENT

An embodiment of the present invention will now be described, by way of example, with reference the accompanying drawings.

Figure 1:
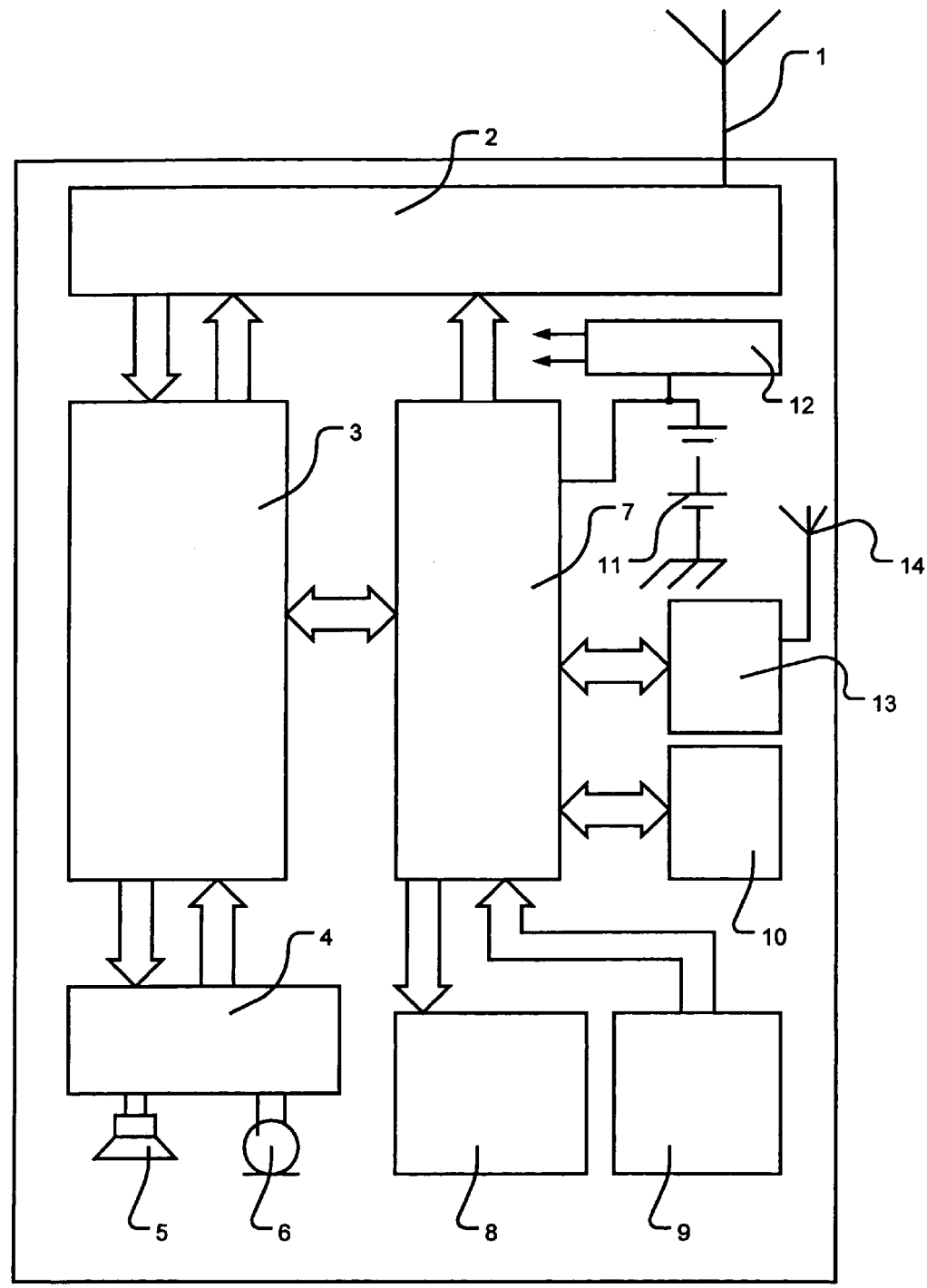
FIG. 1 is a block diagram of a mobile phone including an antenna according to the present invention.

Referring to FIG. 1, a mobile telephone comprises an antenna 1, an rf subsystem 2, a baseband DSP (digital signal processing) subsystem 3, an analog audio subsystem 4, a loudspeaker 5, a microphone 6, a controller 7, a liquid crystal display 8, a keypad 9, memory 10, a battery 11, a power supply circuit 12, a Bluetooth transceiver 13 and a Bluetooth antenna 14.

The rf subsystem 2 contains if and rf circuits of the mobile telephone's transmitter and receiver and a frequency synthesizer for tuning the mobile telephone's transmitter and receiver. The antenna 1 is coupled to the rf subsystem 2 for the reception and transmission of radio waves.

The baseband DSP subsystem 3 is coupled to the rf subsystem 2 to receive baseband signals therefrom and for sending baseband modulation signals thereto. The baseband DSP subsystems 3 includes codec functions which are well-known in the art.

The analog audio subsystem 4 is coupled to the baseband DSP subsystem 3 and receives demodulated audio therefrom. The analog audio subsystem 4 amplifies the demodulated audio and applies it to the loudspeaker 5. Acoustic signals, detected by the microphone 6, are pre-amplified by the analog audio subsystem 4 and sent to the baseband DSP subsystem 4 for coding.

The controller 7 controls the operation of the mobile telephone. It is coupled to the rf subsystem 2 for supplying tuning instructions to the frequency synthesizer and to the baseband DSP subsystem for supplying control data and management data for transmission. The controller 7 operates according to a program stored in the memory 10. The memory 10 is shown separately from the controller 7. However, it may be integrated with the controller 7. A timer for triggering interrupts is also provided by the controller 7.

The display device 8 is connected to the controller 7 for receiving control data and the keypad 9 is connected to the controller 7 for supplying user input data signals thereto. Amongst other function, the display device displays the estimated extant life of the battery 11.

The battery 11 is connected to the power supply circuit 12 which provides regulated power at the various voltages used by the components of the mobile telephone. The positive terminal of the battery 11 is connected to an analog-to-digital converter (ADC) input of the controller 7.

The Bluetooth transceiver 13 is controlled by the controller 7 and sends and receives signals via the Bluetooth antenna 14.

Figure 2:
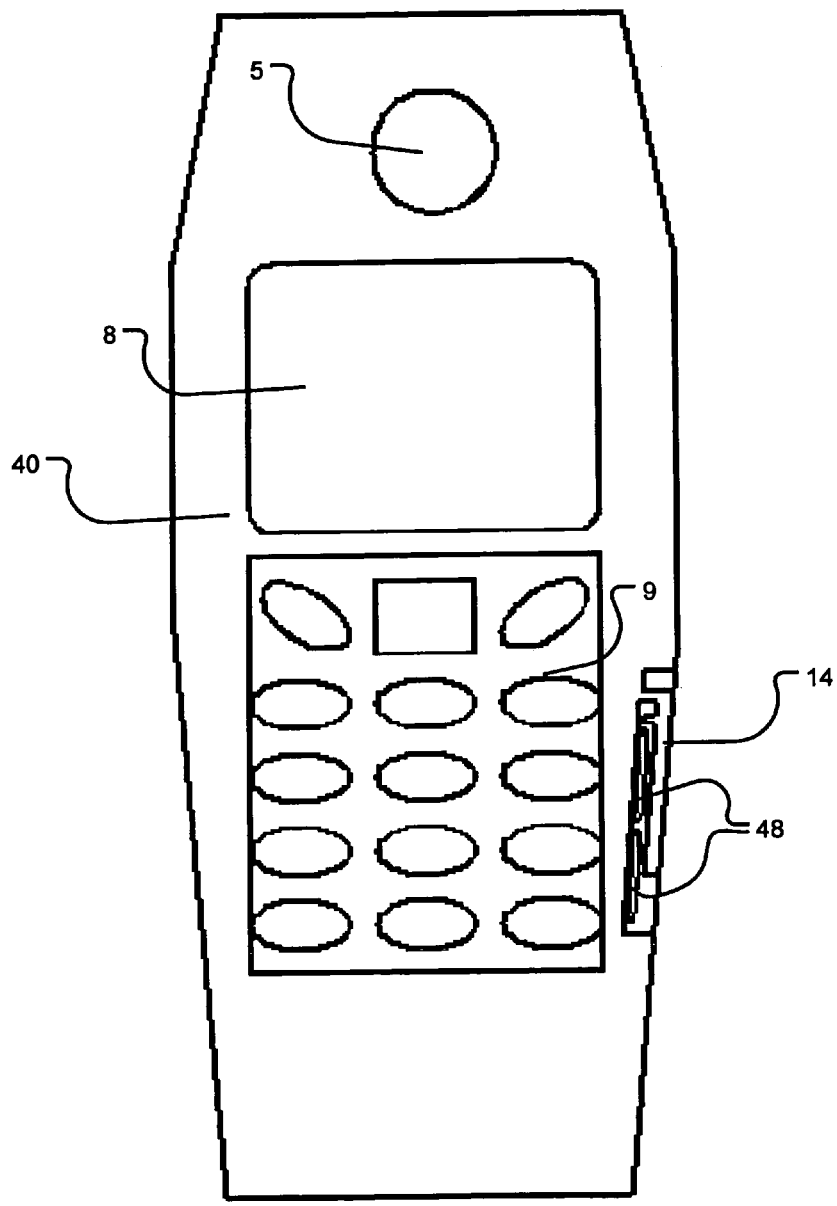
FIG. 2 illustrates the arrangement of an antenna according to the present invention on the main PCB of the mobile phone of FIG. 1.

Referring to FIG. 2, the PCB 40 of the mobile phone has an upper end on which the loudspeaker 5 is mounted. The display 8 is mounted below the loudspeaker 5 and below the display is the keypad 9. The Bluetooth antenna 14 comprises an inverted-F antenna formed in a small strip-shaped region to the side of the keypad 9.

Figure 3:
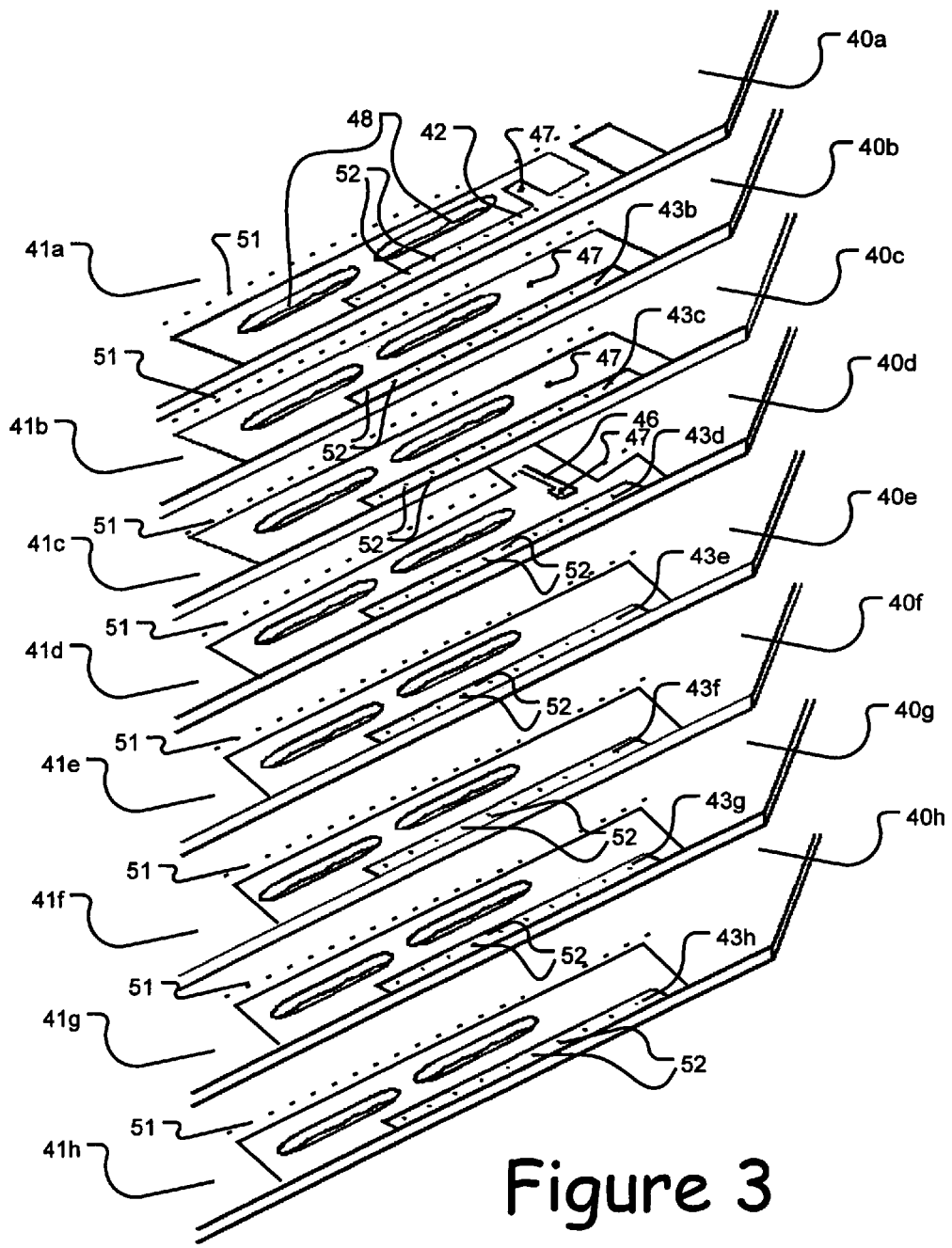
FIG. 3 is an exploded view of the antenna of FIG. 2.

Referring also to FIG. 3, the PCB 40 has first to eighth layers 40a, ... 40h (shown with exaggerated thickness). The layers 40a, ..., 40h have respective ground plane areas 41a, ..., 41h. The ground planes 41a, ..., 41h are partially removed at the edges of the layers 40a, ..., 40h. However, an F-shaped region 42 of conductor is left on the first layer 40a. The "upright" of the F-shaped region 42 runs along the very edge of the first layer 40a with the "arms" directed inwards towards the ground plane 41a. Only the upper "arm" actually joins the ground plane 41a.

On the second to eighth layers 40b, ..., 40h, an I-shaped region 43b, ... 143h of conductor is left along the edge under the "upright" of the F-shaped region 42 and coextensive therewith. The eighth layer 40h may be double sided and also have an I-shaped region on its other side.

The fourth layer 40d includes the feed 46 to the antenna which extends to a point under the shorter "arm" of the F-shaped region 42.

The "upright" of the F-shaped region 42 and the I-shaped regions 43b, ..., 43h are connected by a plurality of vias 52. This unites these regions which collectively form the radiating element of the Bluetooth antenna 14. Similarly, the feed 46 is connected to the shorter "arm" of the F-shaped region 42 by a via 47. A row of vias 51 unites the edges of the ground plane areas 41a, ..., 41h, which are substantially parallel to the "upright" of the F-shaped region 42, to form a ground plane for the antenna.

In order to reduce losses, two slots 48, are cut through the full thickness of the PCB 40. The slots 48 are located so that they are between the "upright" of the F-shaped region 42 and the ground plane on the first layer 40a, and extend parallel to the "upright" of the F-shaped region 42.

It will be appreciated that many modifications may be made to the above-described embodiment. For example, the I-shaped regions could be replaced with L-shaped regions which match the "upright" and upper arm parts of the F-shaped region or further F-shaped regions.

The antenna may be formed using other multilayer PCB structures, for instance three double-sided PCB layers (i.e. copper on both faces) may form the second to seventh layers of the antenna with single-sided PCB being used to form the first and eighth antenna layers.

Other forms of antenna, for example resonant dipoles, can be formed in a similar manner. Furthermore, multi-element antennas may be formed if directivity is a desirable characteristic. Additionally, a plurality of antennas by be formed on the same PCB or in the same way on different PCBs to provide path diversity, directivity or omnidirectivity as desired.

What is claimed is:

1. An antenna comprising:
   an element; and wherein
   the element is formed from conductor patterns on a plurality of layers including at least one buried layer of a multilayer PCB, the PCB is apertured at a location that is adjacent to the element and between an I-, L-, or F-shaped conductor pattern and a ground plane area, and the conductor patterns are in stacked relation and interconnected through the PCB.

2. An antenna according to claim 1, wherein the ground plane comprises:
   an antenna ground plane comprising a plurality of vias connecting ground plane regions on respective PCB layers.

3. An antenna according to claim 1, wherein interconnection of the conductor patterns is from the conductor patterns through the at least one buried layer, and wherein the interconnection is by vias extending through the at least one buried layer of the PCB.

4. A mobile phone including an antenna disposed therein, said antenna comprising an element formed from conductor patterns on a plurality of layers including at least one buried layer of a multilayer PCB, wherein the conductor patterns are in stacked relation and interconnected through the PCB, and wherein the PCB is apertured at a location that is adjacent to the element and between an I-, L-, or F-shaped conductor pattern and a ground plane area.

5. A mobile phone according to claim 4, wherein the ground plane comprises an antenna ground plane comprising a plurality of vias connecting ground plane regions on respective PCB layers.

6. A mobile phone according to claim 4, wherein interconnection of the conductor patterns is from the conductor patterns through the at least one buried layer, and wherein the interconnection is by vias extending through the at least one buried layer of the PCB.

7. An antenna structure, comprising:
   a substrate having a footprint;
   an antenna trace having an I-, L-, or F-shape and a perimeter formed on a face of said substrate proximate a ground plane of said substrate and said perimeter being substantially co-planar with said face, wherein said substrate has a predetermined radio frequency loss associated therewith; and
   a low-loss region extending through said substrate, wherein said low-loss region is an opening located within said footprint that extends transverse to and intersects a plane of said face, and said low-loss region located between said antenna trace and said ground plane, wherein said low-loss region has a radio frequency loss less than said radio frequency loss associated with said substrate, and wherein said low-loss region is located outside of said perimeter of said antenna trace.

8. The antenna structure recited in claim 7 further including a plurality of said low-loss regions.

9. The antenna structure recited in claim 8 wherein each of said low-loss regions is separated by a portion of said substrate.

10. The antenna structure recited in claim 7 wherein said low-loss region comprises air.

11. The antenna structure recited in claim 7 wherein said antenna trace includes antenna traces located on opposing surfaces of said substrate and connected by a via.

12. The antenna structure recited in claim 7 wherein said substrate is comprised of a high loss material.

13. A method of manufacturing an antenna structure, comprising:
   forming an antenna trace having an I-, L-, or F-shape and a perimeter formed on a face of a substrate having a footprint proximate a ground plane of said substrate and said perimeter being substantially co-planar with said face, wherein said substrate has a predetermined radio frequency loss associated therewith; and
   creating a low-loss region extending through said substrate and located between said antenna trace and said ground plane, wherein said low-loss region is an opening located within said footprint that extends transverse to and intersects a plane of said face, and wherein said low-loss region has a radio frequency loss less than said radio frequency loss associated with said substrate, and wherein said low-loss region is located outside said perimeter of said antenna trace.

14. The method recited in claim 13 wherein said creating includes creating a plurality of low-loss regions.

15. The method recited in claim 13 wherein said creating includes creating a plurality of low-loss regions separated by a portion of said substrate.

16. The method recited in claim 13 wherein said substrate is comprised of a high-loss material.

17. The method recited in claim 13 wherein said creating includes creating a low-loss region comprising air.

18. The method recited in claim 13 wherein said forming includes forming antenna traces located on opposing surfaces of said substrate interconnected by a via extending through said substrate.

19. A printed circuit board (PCB), comprising:
a substrate having a footprint and a ground plane and conductive traces formed thereon, wherein said substrate has a predetermined radio frequency loss associated therewith; and
an antenna structure, including:
an antenna trace having an I-, L-, or F-shape and a perimeter formed on a face of a substrate proximate a ground plane of said substrate and said perimeter being substantially co-planar with said face, wherein said substrate has a predetermined radio frequency loss associated therewith; and
a low-loss region extending through said substrate and located between said antenna trace and said ground plane, wherein said low-loss region is an opening located within said footprint that extends transverse to and intersects said face, and wherein said low-loss region has a radio frequency loss less than said radio frequency loss associated with said substrate, and wherein said low-loss region is located outside said perimeter of said antenna trace.

20. The PCB recited in claim 19 wherein said substrate is comprised of a high-loss material.

21. The PCB recited in claim 19 wherein said low-loss region includes a plurality of low-loss regions separated by a portion of said substrate.

22. The PCB recited in claim 19 wherein said substrate has a footprint, and said low-loss region is an opening located within a said footprint of said substrate.

23. The PCB recited in claim 22 wherein said low-loss region includes a low-loss material comprising air.

24. The PCB recited in claim 19 wherein said antenna trace includes antenna traces located on opposing surfaces of said substrate interconnected by a via extending through said substrate.

25. An antenna structure, comprising:
an antenna trace having an I-, L-, or F-shape and being formed on a substrate proximate a ground plane of said substrate, wherein said substrate has a footprint and a predetermined radio frequency loss associated therewith; and
a low-loss region extending through said substrate and located between said antenna trace and said ground plane, wherein said low-loss region is an opening located within said footprint that extends transverse to and intersects a plane of said face, and wherein said low-loss region has a radio frequency loss less than said radio frequency loss associated with said substrate, and said antenna trace does not overlap said low-loss region.

26. An antenna structure, comprising:
a planar antenna trace having an I-, L-, or F-shape and being formed on a substrate;
a ground plane formed on said substrate, wherein a plane of said substrate on which said planar antenna is located is co-planar or parallel with a plane of said substrate on which said ground plane is located, and said ground plane is non-overlapping with said planar antenna trace; and
an insulation region extending through said substrate and located between said planar antenna trace and said ground plane.

27. The antenna structure recited in claim 26, wherein said planar antenna trace is a first planar antenna trace and said antenna structure further includes a second planar antenna trace located on an opposing, parallel surface of said substrate and said first and second planar antenna traces are interconnected by a via extending through said substrate.

28. The antenna structure recited in claim 26 wherein said insulation region includes a plurality of insulation regions.

29. The antenna structure recited in claim 28 wherein each of said insulation regions are separated by a portion of said substrate.

30. The antenna structure recited in claim 26 wherein said insulation region is an opening that extends through said substrate and an insulator of said insulation region is air.

31. The antenna structure recited in claim 26 wherein said substrate is a lossy substrate.

32. A method of manufacturing an antenna structure, comprising:
forming a planar antenna trace on a substrate, the trace having an I-, L-, or F-shape;
forming a ground plane on said substrate, wherein a plane of said substrate on which said planar antenna is located is co-planar or parallel with a plane of said substrate on which said around plane is located, and said ground plane is non-overlapping with said planar antenna trace; and
creating an insulation region extending through said substrate and located between said planar antenna trace and said ground plane.

33. The method recited in claim 32, wherein said planar antenna trace is a first planar antenna trace and said antenna structure further includes a second planar antenna trace located on an opposing, parallel surface of said substrate and said first and second planar antenna traces are interconnected by a via extending through said substrate.

34. The method recited in claim 32, wherein said creating includes creating a plurality of insulation regions.

35. The method recited in claim 32, wherein said creating a plurality of insulation regions includes creating a plurality of insulation regions separated by a portion of said substrate.

36. The method recited in claim 32, wherein said creating an insulation region includes creating an opening that extends through said substrate and wherein an insulator of said insulation region is air.

37. The method recited in claim 32, wherein said forming includes forming antenna traces located on opposing surfaces of said substrate interconnected by a via extending through said substrate.

38. A printed circuit board (PCB), comprising,
a substrate having
a ground plane and conductive traces formed thereon; and
a planar antenna structure, including: an antenna trace having an I-, L-, or F-shape and being formed on said substrate; said planar ground plane formed on said substrate, wherein a plane of said substrate on which said planar antenna is located is co-planar or parallel with a plane of said substrate on which said ground plane is locate, and said ground plane is non-overlapping with said antenna trace; and
an insulation region extending through said substrate and located between said antenna trace and said ground plane.

39. The PCB recited in claim 38, wherein said planar antenna trace is a first planar antenna trace and said antenna structure further includes a second planar antenna trace located on an opposing, parallel surface of said substrate and said first and second planar antenna traces are interconnected by a via extending through said substrate.

40. The PCB recited in claim 38, further including electrical components mounted on said substrate and interconnected between at least one of said conductive traces and said ground plane to form an operative circuit.

41. The PCB recited in claim 38, wherein said insulation region includes a plurality of insulation regions separated by a portion of said substrate.

42. The PCB recited in claim 38, wherein said insulation region is an opening that extends through said substrate and an insulator of said insulation region is air.

43. An antenna structure, comprising:
  an antenna substrate having a planar surface, said antenna substrate having a predetermined radio frequency loss associated therewith;
  a planar antenna trace having an I-, L-, or F-shape, being formed on said planar surface, and extending along and adjacent an edge of said planar surface;
  a ground plane formed on said antenna substrate, wherein said ground plane is non-overlapping with said planar antenna trace; and
  a low-loss region located between said planar antenna trace and said ground plane, said low-loss region having a longitudinal axis extending along only a portion of and adjacent said edge, and having a radio frequency loss less than said predetermined radio frequency loss.

44. The antenna structure recited in claim 43, wherein said low-loss region is non-overlapping with said planar antenna trace.

45. The antenna structure recited in claim 44, wherein said ground plane is a planar ground plane and is located on said planar surface and is co-planar with said planar antenna trace.

46. The antenna structure recited in claim 43 further including a plurality of said low-loss regions, wherein each of said low-loss regions is separated by a portion of said substrate and each of said plurality is non-overlapping with said planar antenna trace.

47. The antenna structure recited in claim 43 wherein said low-loss region comprises air.

48. The antenna structure recited in claim 43 wherein said planar antenna trace comprises a first portion that extends in one direction along said edge and a second portion that extends in an opposite direction along said edge.

49. The antenna structure recited in claim 43 wherein said low-loss region is an opening that extends through a thickness of said substrate.

50. A method of manufacturing an antenna structure, comprising:
  providing an antenna substrate having a planar surface, said antenna substrate having a predetermined radio frequency loss associated therewith,
  forming a planar antenna trace on said planar surface along and adjacent an edge of said planar surface, the antenna trace having an I-, L-, or F-shape
  placing a ground plane on said antenna substrate, wherein said ground plane is non-overlapping with said planar antenna trace; and
  creating a low-loss region between said planar antenna trace and said ground plane, said low-loss region having a longitudinal axis extending along only a portion of and adjacent said edge, said low-loss region having a radio frequency loss less than said predetermined radio frequency loss.

51. The method recited in claim 50, wherein said low-loss region is non-overlapping with said planar antenna trace.

52. The method recited in claim 50, wherein said ground plane is a planar ground plane formed on said planar surface and co-planar with said planer antenna trace.

53. The method recited in claim 50 wherein said creating includes creating a plurality of low-loss regions, wherein each of said low-loss regions is separated by a portion of said substrate and each of said plurality is non-overlapping with said planar antenna trace.

54. The method recited in claim 50 wherein said creating includes creating a low-loss region comprising air.

55. The method recited in claim 50 wherein said forming includes forming first and second portions of said planar antenna trace where said first portion extends in one direction along said edge and the second portion extends in an opposite direction along said edge.

56. The method recited in claim 50 wherein said creating said low-loss region comprises forming an opening that extends through a thickness of said substrate.

57. An inverted F-antenna comprising:
  an element, and wherein
  the element is formed from conductor patterns on a plurality of layers including at least one buried layer of a multilayer PCB, and the conductor patterns are in stacked relation and interconnected through the PCB, and the conductor patterns comprise an F-shaped conductor pattern on a first layer of the PCB and an I-, L- or F-shaped conductor pattern on the or each other layer, wherein the or each I-, L- or F-shaped conductor pattern comprises an upright substantially coextensive with an upright of the F-shaped conductor pattern on the first layer, the or each I-, L- or F-shaped conductor pattern extends along the edge of the PCB, and wherein the PCB is apertured between the upright of the F-shaped conductor pattern and a ground plane area.

58. An antenna comprising:
  an element; and wherein
  the element is formed from conductor patterns on a plurality of layers including at least one buried layer of a multilayer PCB, the conductor patterns are in stacked relation and interconnected through the PCB, and the PCB is apertured between an upright of an F-shaped conductor pattern and a ground plane area.

59. A mobile phone including an inverted F-antenna comprising an element formed from conductor patterns on a plurality of layers including at least one buried layer of a multilayer PCB, wherein the conductor patterns are in stacked relation and interconnected through the PCB, and comprise an F-shaped conductor pattern on a first layer of the PCB and an I-, L- or F-shaped conductor pattern on the or each other layer, wherein the or each I-, L- or F-shaped conductor pattern comprises an upright substantially coextensive with the upright of the F-shaped conductor pattern, wherein the or each I-, L- or F-shaped conductor pattern extends along the edge of the PCB, and wherein the PCB is apertured between the upright of the F-shaped conductor pattern and a ground plane area.

60. A mobile phone including an antenna comprising an element formed from conductor patterns on a plurality of layers including at least one buried layer of a multilayer PCB, wherein the conductor patterns are in stacked relation and interconnected through the PCB, and wherein the PCB is apertured between an upright of an F-shaped conductor pattern and a ground plane area.

* * * * *